United States Patent
Zink et al.

[11] Patent Number: 5,978,268
[45] Date of Patent: Nov. 2, 1999

[54] CIRCUIT FOR THE GENERATION OF VOLTAGE FOR THE PROGRAMMING OR ERASURE OF A MEMORY THAT USES FLOATING-GATE TRANSISTORS

[75] Inventors: Sebastien Zink; David Naura, both of Aix-en-Provence, France

[73] Assignee: STMicroelectronics S.A., Gentilly, France

[21] Appl. No.: 09/179,635

[22] Filed: Oct. 27, 1998

[30] Foreign Application Priority Data

Oct. 29, 1997 [FR] France .................................. 97 13751

[51] Int. Cl.⁶ ......................................................... G11C 7/00
[52] U.S. Cl. ................................ 365/185.18; 365/189.09; 365/226
[58] Field of Search ......................... 365/189.09, 189.11, 365/226, 194, 185.18

[56] References Cited

U.S. PATENT DOCUMENTS

| | | |
|---|---|---|
| 5,101,381 | 3/1992 | Kouzi . |
| 5,408,133 | 4/1995 | Honnigford et al. . |
| 5,446,697 | 8/1995 | Yoo et al. ........................... 365/189.09 |
| 5,594,692 | 1/1997 | Yamaguchi ......................... 365/189.09 |

FOREIGN PATENT DOCUMENTS

| | | | |
|---|---|---|---|
| 0 811 987 A1 | 12/1997 | European Pat. Off. | ........ G11C 16/06 |
| 2 288 678 | 10/1995 | United Kingdom | .......... G11C 11/407 |
| WO 97/48100 | 12/1997 | WIPO | ............. G11C 16/06 |

*Primary Examiner*—Vu A. Le
*Attorney, Agent, or Firm*—Allen, Dyer, Doppelt, Milbrath & Gilchrist, P.A.

[57] ABSTRACT

A voltage circuit generates a programming or erasure voltage for programming or erasing a floating-gate memory. The voltage generator circuit includes a charge pump to provide a pumped voltage and a shaping circuit to provide the programming or erasing voltage from the pumped voltage. A switching circuit enables the pumped voltage to reach a sufficient level before the shaping circuit generates the programming or erasure voltage.

21 Claims, 3 Drawing Sheets

FIG_1

FIG_2a

FIG_2b

FIG_3

FIG_6A

FIG_6B

FIG_6C

FIG_6D

FIG_6E

FIG_6F

CIRCUIT FOR THE GENERATION OF VOLTAGE FOR THE PROGRAMMING OR ERASURE OF A MEMORY THAT USES FLOATING-GATE TRANSISTORS

FIELD OF THE INVENTION

The invention relates to the field of memory devices and, more particularly, to a circuit for the generation of a voltage for programming or erasing a floating-gate memory.

BACKGROUND OF THE INVENTION

Programming and erasure of a trapped charge stored on a floating-gate transistor is done by application of high voltages between a gate and a drain to charge or discharge the floating gate. The charge reaches the floating gate by tunneling. The voltage to be applied to the transistor must be gradual in order to prevent any breakdown of the insulating material. Voltage ramp generators are known in the prior art. For example, a ramp generator system is described in the application EP-A-0 762 428.

Figure 1:
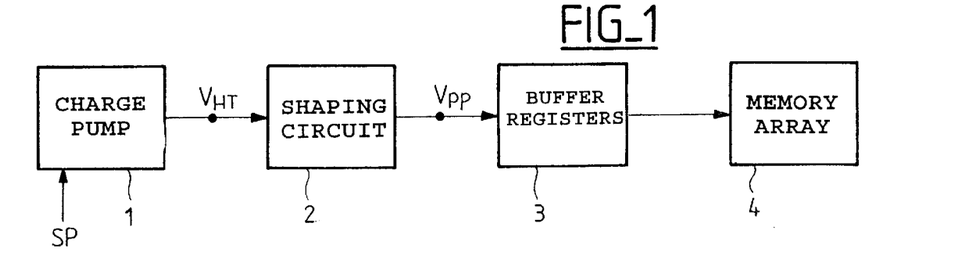
FIG. 1 shows a programming voltage generator according to the prior art.

FIG. 1 shows the circuits used during the programming of a floating-gate memory. A charge pump 1 provides a pumped voltage $V_{HT}$. This charge pump 1 is controlled by a binary programming signal SP. The programming signal SP activates the operation of the charge pump during the programming. A shaping circuit 2 receives the pumped voltage $V_{HT}$ and produces a programming voltage $V_{PP}$ having an increase regulated gradually so as not to damage the floating gate transistors. The programming voltage $V_{PP}$ is applied to buffer registers 3, in which the data elements to be programmed have been loaded beforehand. One or more buffer registers 3 are connected to a memory array 4. An increase in the programming voltage $V_{PP}$ prompts a gradual increase of the output voltage of the buffer registers 3. This causes the contents of at least one of the buffer registers 3 to be written in the memory array. Erasure is done according to a similar principle with, however, a few differences. It is possible to replace the buffer registers with row decoder circuits to reverse the biasing of the cells. Also, for example, the same circuits can be used with a negative programming voltage.

Figure 2A:
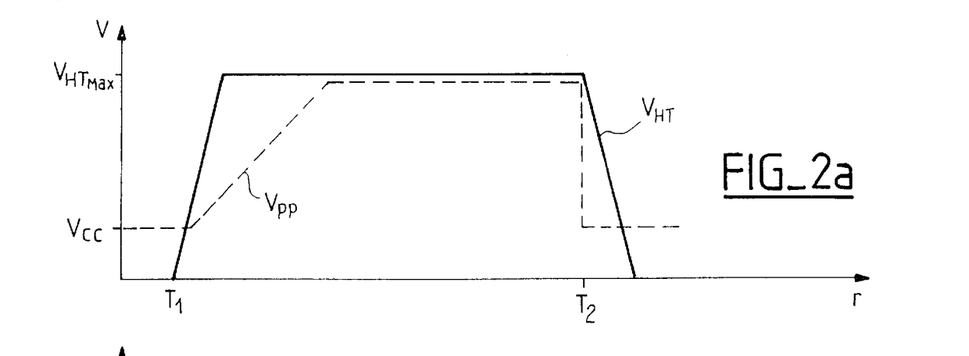
FIGS. 2a and 2b show curves of operation of the prior art circuit of FIG. 1.

In the case of a programming operation, a voltage square wave is generated at an output of the charge pump 1 and at an output of the shaping circuit 2, as shown in FIG. 2a. At the instant $T_1$, the programming signal is activated. This prompts a rapid growth of the pumped voltage $V_{HT}$, which will increase up to a maximum pumped voltage $V_{HTMAX}$. The pumped voltage $V_{HT}$ is regulated so that it is maintained at $V_{HTMAX}$. At the instant $T_2$, the programming signal is deactivated which ends the programming. The charge pump 1 stops and the pumped voltage $V_{HT}$ diminishes to zero volts.

The voltage $V_{PP}$ is a constant voltage equal to the supply voltage $V_{CC}$ of the integrated circuit when the programming signal SP is deactivated. When the programming signal SP is active, the programming voltage $V_{PP}$ becomes equal to the pumped voltage $V_{HT}$. However, the shaping circuit limits the increase of the programming voltage $V_{PP}$ in order not to damage the storage transistors.

FIG. 2a corresponds to a normal operation for a charge pump 1 which provides sufficient current. As soon as the programming voltage $V_{PP}$ increases, the charge pump 1 must provide a current to the circuits supplied with the programming voltage $V_{PP}$. In particular, for the buffer registers 3 loaded by the storage transistors of the memory array to which they are connected, the greater the increase of the programming voltage given by $V_{PP}$, the higher the current provided by the charge pump 1.

Figure 2B:
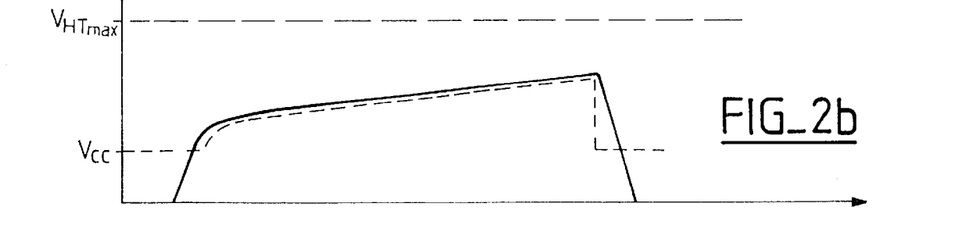

If the charge pump 1 is undersized, the operation becomes as shown in FIG. 2b. In FIG. 2b, the pumped voltage $V_{HT}$ increases rapidly until the programming voltage $V_{PP}$ begins to increase. The charge pump 1 must provide substantial current to the buffer registers 3 which greatly limits the increase of the pumped voltage $V_{HT}$. FIG. 2b shows an extreme case where the charge pump 1 cannot reach the voltage $V_{HTMAX}$ necessary to provide for programming.

To prevent a problem of this kind, the charge pump 1 is sized as a function of the maximum current that it has to supply, while at the same time being able to swiftly increase the pumped voltage $V_{HT}$. Those skilled in the art know that the maximum output current of the charge pump 1 is proportional to $C*F/n$. C is the capacitance of the capacitors used in the output stages of the pump, F is the pumping frequency, and n is the number of output stages of the pump. The number of output stages is fixed as a function of the desired voltage and the supply voltage of the integrated circuit. The increase in the pumping frequency causes an increase in consumption, problems of parasitic emission (radiation), and risks of loss of synchronization (excessively rapid switching of the output stages). The increase in the capacitance values leads to an increase in the size of the pump.

At present, the programming (or erasure) can be done by word, by page of words, or for the entire memory. Total programming is essentially used to reduce the duration of the manufacturer's tests on the memory. A system sized for the efficient performance of total programming is oversized for the programming of only one word.

SUMMARY OF THE INVENTION

An object of the invention resolves problems associated with overriding a charge pump. A switching circuit is added to switch over the pumped voltage after a certain period of time so that the pumped voltage reaches a sufficient level before passing through high current. The charge pump is designed to maintain the pumped voltage at its maximum value under load. This makes it possible to have a smaller charge pump.

Another object of the invention is to provide a floating-gate memory comprising a programming or erasure voltage generator circuit. The voltage generator circuit comprises a charge pump to provide a pumped voltage, and a shaping circuit to provide a programming or erasure voltage from the pumped voltage. The growth of the programming or erasure voltage is gradual. The generator circuit comprises control means to provide a control signal, and a switching circuit to provide the shaping circuit with a switched voltage that is equal either to the pumped voltage, or to a neutral voltage as a function of the control signal.

In one approach, the control means comprises a voltage detection circuit to detect when the pumped voltage has reached a reference voltage and to activate the control signal as soon as the pumped voltage has reached the reference voltage. In another approach, a delay circuit activates the control signal after a predetermined duration has elapsed since a time when the charge pump has been put into operation. In a further approach, a voltage detection circuit and a delay circuit activate the control signal as soon as the pumped voltage has reached a reference voltage or as soon as the charge pump has been activated for a predetermined duration. For each of the approaches, the switching circuit provides the switched voltage equal to the pumped voltage to the shaping circuit when the control signal is active.

Another object of the invention is to provide a method for the generation of a programming or erasure voltage for a floating-gate memory. The pumped voltage is produced by a charge pump and a programming or erasure voltage is produced from the pumped voltage in a shaping circuit to have a gradual increase. The programming or erasure voltage begins to increase after a control signal pertaining to the pumped voltage has become active.

According to another method, the control signal becomes active as soon as the pumped voltage has reached a reference voltage, or as soon as a predetermined duration has elapsed since the beginning of the pumping of the pumped voltage. In yet another method, the control signal becomes active again as soon as the pumped voltage has reached a reference voltage, or as soon as a predetermined duration has elapsed since the beginning of the pumping of the pumped voltage.

BRIEF DESCRIPTION OF THE DRAWINGS

The invention will be understood more clearly and other particular features and advantages shall appear from the following description made with reference to the appended drawings, of which.

DETAILED DESCRIPTION OF THE PREFERRED EMBODIMENTS

Figure 3:
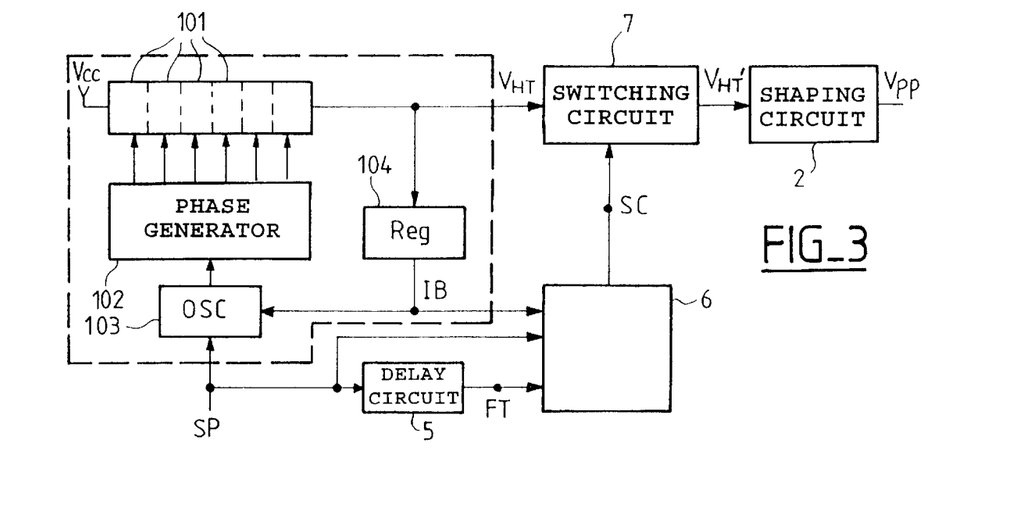
FIG. 3 shows a programming or erasure voltage generator circuit according to the invention.

In FIG. 3, the circuit shown comprises a charge pump 1, a shaping circuit 2, a delay circuit 5, a logic circuit 6 and a switching circuit 7. The charge pump 1 has been described in detail and comprises series-connected output stages 101, a phase generator circuit 102, an oscillator 103 and a regulation circuit 104.

The output stages 101 each receive at least one or two phase signals (depending on the type of output stages), and an input voltage. The output stages 101 each provide an output voltage equal to the input voltage plus the amplitude of the phase signal in steady operation. A first one of the output stages 101 receives the supply voltage from the circuit $V_{CC}$ and the last output stage 101 provides the pumped voltage $V_{HT}$. The phase generator 102 receives a clock signal and produces two or four phase signals at the output stages in an alternate way.

The oscillator 103 is of a controlled type. It has first and second control inputs and provides the clock signal at one output. Conventionally, the oscillator works when the first and second inputs are both in a first state and stops as soon as one of the inputs is in a second state. The first input of the oscillator 103 receives the programming signal SP which indicates that the programming is in progress when it is in the first state.

The regulation circuit 104 receives the pumped voltage $V_{HT}$ and produces a binary indicator IB on one output. The output of the regulation circuit 104 is connected to the second input of the oscillator 103. When the pumped voltage $V_{HT}$ is smaller than a reference voltage which is at least equal to the voltage necessary for the programming of a storage transistor, the binary indicator IB is in the first state. When the pumped voltage $V_{HT}$ is greater than the reference voltage, the binary indicator IB is in the second state. For greater details on the structure and working of the charge pump 1, those skilled in the art may refer to the applications EP-A-0 382 929, EP-A-0 678 802, or EP-A-0 757 427 relating to different elements of the charge pump and the entire disclosures of which are incorporated herein by reference.

The delay circuit 5, which has an input and an output, receives at its input the programming signal and produces an end of delay time indicator FT at its output. The end of delay time indicator FT is a binary type signal which is positioned in the first state after a predetermined period of time has elapsed since a leading edge of the programming signal SP. When the programming signal SP is in the second state, the end of delay time signal is positioned in the second state. The delay circuit 5 is obtained by means of a monostable circuit or by means of a counter.

The logic circuit 6 has first to third binary inputs and one logic output. The first binary input is connected to the output of the regulator circuit 104 to receive the binary indicator IB. The second binary input receives the programming signal SP. The third binary input receives the end of delay time indicator FT. The logic output provides a control signal SC which is inactive when the programming signal is in the second state. The control signal SC becomes active as soon as the programming signal SP is in the first state and as soon as the binary indicator IB has a leading edge. The control signal SC is also active as soon as the programming signal SP is in the first state and as soon as the end of delay time signal FT shows a leading edge.

The switching circuit 7 has a control input, a voltage input and a voltage output. The voltage input receives the pumped voltage $V_{HT}$. The control input receives the control signal SC. The voltage output provides a switched voltage $V_{HT}'$ which is zero when the control signal is inactive and is equal to the pumped voltage $V_{HT}$ when the control signal is active.

The shaping circuit 2 receives the switched voltage $V_{HT}'$ and provides the programming voltage $V_{PP}$. The programming voltage $V_{PP}$ is equal to the supply voltage $V_{CC}$ when the switched voltage $V_{HT}'$ is zero. As soon as the switched voltage $V_{HT}'$ is greater than the supply voltage $V_{CC}$, the programming voltage $V_{PP}$ will increase gradually until it reaches a maximum programming voltage value. The shaping circuit is described, for example, in the application EP-A-0 762 428.

In one approach, it is not necessary for the switching circuit to provide a zero voltage. The important thing is for the switching circuit 7 to provide a neutral voltage to the shaping circuit 2. The term "neutral voltage" is understood to mean a voltage that makes the shaping circuit inactive. For example, the neutral voltage may range from 0 volts to the supply voltage $V_{CC}$. It may correspond to a high impedance type output whose voltage is fixed by the shaping circuit 2.

In the example described above, reference has been made to the programming of the storage transistors. It is clear that a circuit of this kind can also be used for the erasure of these same storage transistors. For an erasure, the voltages applied to the storage transistors are reversed with respect to a programming operation. In certain memories, only positive voltages are used. In this case, it is necessary to use a routing circuit to direct the programming voltage to the row decoding circuits of the memory array during the erasure. If a negative erasure voltage is used, then the present invention must be adapted to work with negative voltages.

Figure 4:
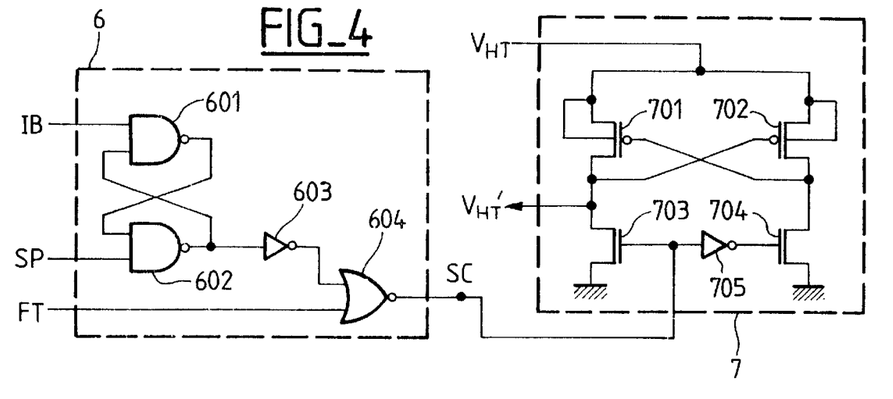
FIG. 4 shows a switching circuit used in the invention.

FIG. 4 shows a preferred embodiment of the logic circuit 6 and of the switching circuit 7. The logic circuit 6 has first and second two-input NAND gates 601 and 602, one inverter gate 630 and one two-input NOR gate 604. The first and second NAND gates 601 and 602 are connected to form a R-S bistable circuit. One input of the first NAND gate 601 receives the binary indicator IB and one input of the second NAND gate 602 receives the programming signal SP. The input of the inverter gate 603 is connected to the output of the second NAND gate 602. The first input of the NOR gate 604 is connected to the output of the inverter gate 603. The second input of the NOR gate 604 receives the end of delay time signal FT. The output of the NOR gate 604 provides the control signal SC.

The switching circuit 7 comprises first and second P-type transistors 701 and 702, third and fourth N-type transistors 703 and 704, and one inverter 705. The sources of the first and second transistors 701 and 702 are connected together and receive the pumped voltage $V_{HT}$. The drain of the first transistor 701 is connected to the gate of the second transistor 702 and to the drain of the third transistor 703. The drain of the second transistor 702 is connected to the gate of the first transistor 701 and to the drain of the fourth transistor 704. The sources of the third and fourth transistors 703 and 704 are connected to ground. The gate of the third transistor 703 and the input of the inverter 705 are connected together to the output of the logic circuit 6 and receive the control signal SC. The gate of the fourth transistor 704 is connected to the output of the inverter 705. The switched voltage $V_{HT}'$ is provided by the node formed by the drains of the first and third transistors 701 and 703.

The invention can be summarized as providing a circuit to delay application of the pumped voltage $V_{HT}$ to the shaping circuit 2. The delay is induced in the preferred embodiment by a control circuit comprising a voltage detection circuit which includes the regulation circuit 104 of the charge pump 1, the delay circuit 5, and the logic circuit 6.

Figure 5A:
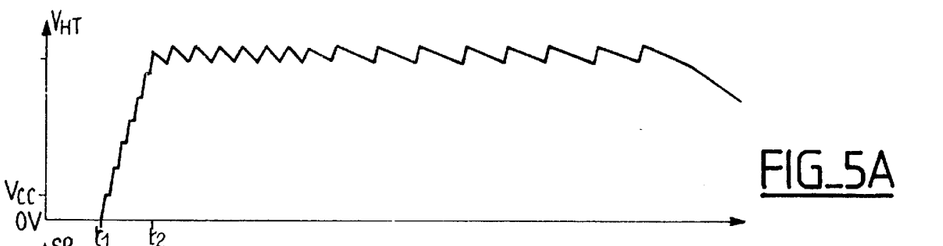
FIGS. 5A–5F show timing diagrams of operation of the invention when the charge pump is "fast"
Figures 5B, 5C:
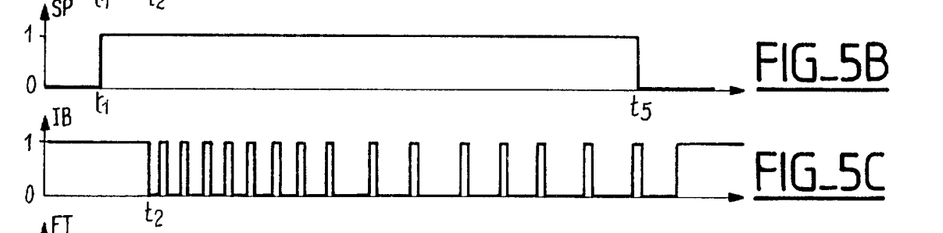
Figures 5D, 5E:
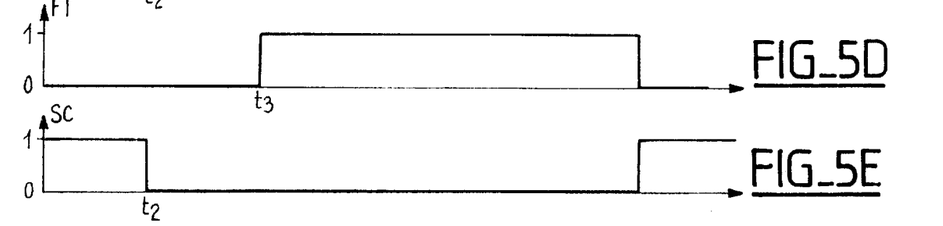
Figure 5E:
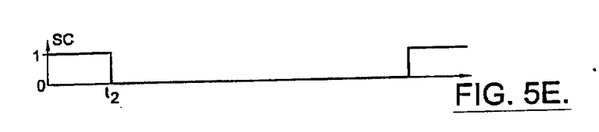
Figure 5F:
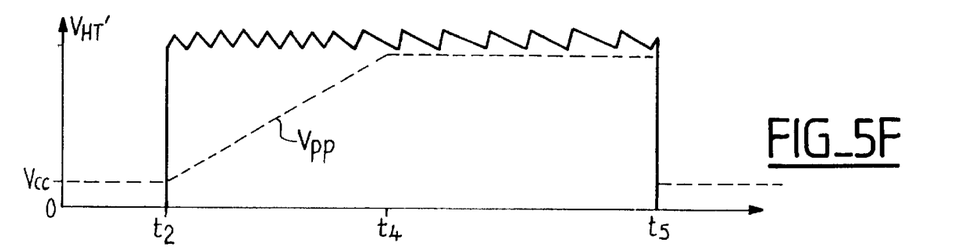

FIGS. 5A to 5F represent the delay diagrams of operation of the invention when the charge pump is "fast". In the example shown, there is a supply voltage $V_{CC}$ equal to 3V, a reference voltage of 18V for the regulation circuit 104 and a maximum programming voltage of 16.5V regulated by the shaping circuit 2. FIG. 5A shows the output pumped voltage $V_{HT}$ of the charge pump 1. The saw-tooth patterns correspond to the pumping of the charge pump 1. FIGS. 5B–5D respectively show the programming signal SP, the binary indicator IB and the end of delay time signal FT. For FIGS. 5B–5D, the first state corresponds to a logic state 1 and the second state corresponds to a logic state 0. FIG. 5E shows the control signal SC, which is active at the logic level 0. FIG. 5F shows the switched voltage $V_{HT}'$ in an unbroken line and the programming voltage $V_{PP}$ in a dashed line. The programming voltage $V_{PP}$ is shown with a simple increase in order to simplify the drawing.

At the instant $t_1$, the programming signal becomes active thus activating the pumping of the charge pump 1. At the instant $t_2$, the pumped voltage reaches the maximum value. This positions the binary indicator IB in the second state. The control signal becomes active making the switched voltage $V_{HT}'$ equal to the pumped voltage $V_{HT}$ and consequently the programming voltage $V_{PP}$ will grow. At the instant $t_3$, the delay time ends. The end of delay time signal goes to the first state without affecting the rest of the circuit. At the instant $t_4$, the programming voltage $V_{PP}$ reaches its maximum value. At the instant $t_5$, the programming signal SP goes to the second state, indicating the end of programming. This has the effect of making the control signal SC inactive and making the switched voltage $V_{HT}'$ zero. The programming voltage $V_{PP}$ then becomes equal to the supply voltage $V_{CC}$. Between the instants $t_2$ and $t_4$, the growth of the programming voltage draws a greater current than between the instants $t_4$ and $t_5$. This results in a greater activation of the charge pump 1 which, however, has little effect on the pumped voltage $V_{HT}$.

Figure 6A:
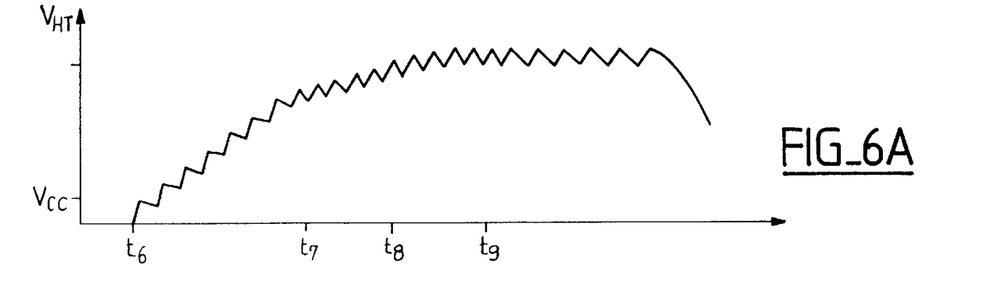
FIGS. 6A–6F show timing diagrams of operation of the invention when the charge pump is "slow".
Figure 6B:
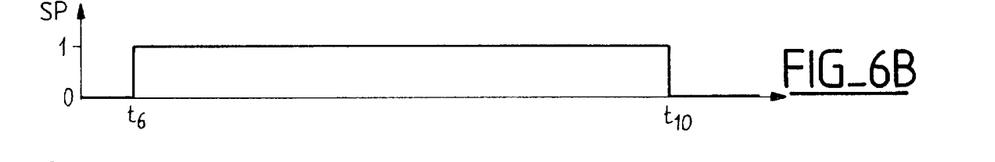
Figure 6C:
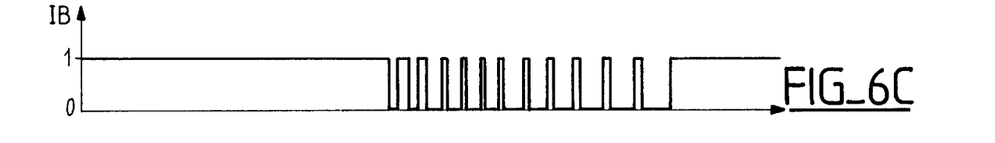
Figure 6D:
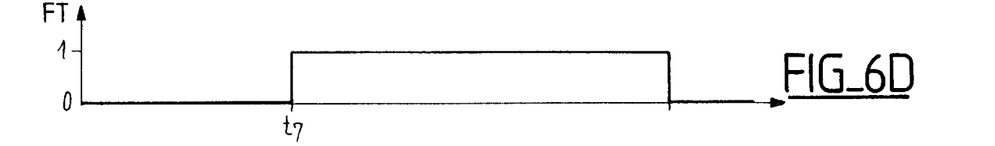
Figure 6E:
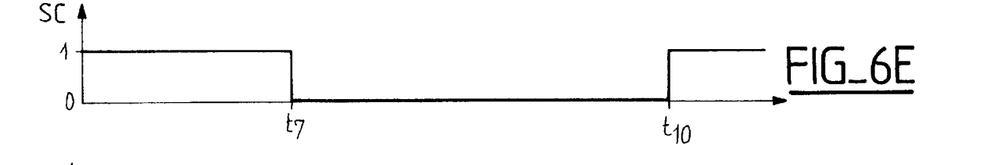
Figure 6F:
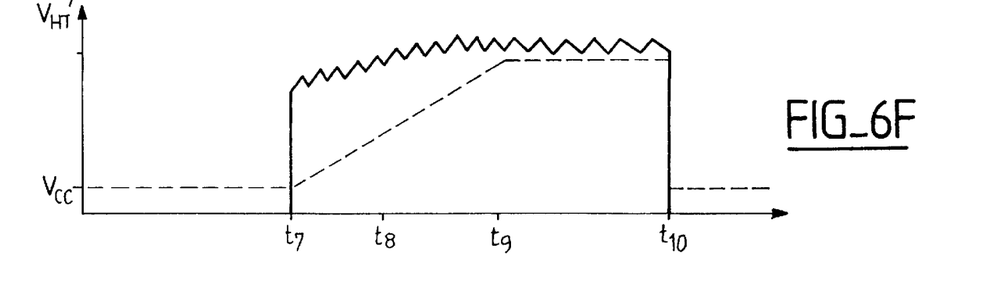

FIGS. 6A–6F show the timing diagrams of operation of the invention when the charge pump 1 is "slow". In the example shown, there is a supply voltage $V_{CC}$ equal to 3V, a reference voltage of 18V for the regulation circuit 104, and a maximum programming voltage of 16.5V. FIG. 6A shows the output pumped voltage $V_{HT}$ from the charge pump 1. The sawtooth pattern corresponds to the pumping of the charge pump 1. FIGS. 6B–6D respectively show the programming signal SP, the binary indicator IB and the end of delay time signal FT. For FIGS. 6B–6D, the first state corresponds to a logic state 1 and the second state corresponds to a logic state 0. FIG. 6 shows the control signal SC, which is active at the logic level 0. FIG. 6F shows the switched voltage $V_{HT}'$ in an unbroken line and the programming voltage $V_{PP}$ in a dashed line. The programming voltage $V_{PP}$ shows a simple increase with a view to simplifying the drawing.

At the instant $t_6$, the programming signal becomes active. This activates the pumping of the charge pump 1. At the instant $t_7$, the delay time ends. The end of delay time signal goes into the first state. The control signal becomes active, making the switched voltage $V_{HT}'$ equal to the pumped voltage $V_{HT}$ and consequently the programming voltage $V_{PP}$ will increase. At the instant $t_8$, the pumped voltage reaches the maximum value. This positions the binary indicator IB in the second state without any effect on the rest of the circuit. At the instant $t_9$, the programming voltage $V_{PP}$ reaches its maximum value. At the instant $t_{10}$, the programming signal SP goes into the second state, indicating the end of programming. This has the effect of making the control signal SC inactive and making the switched voltage $V_{HT}'$ equal to zero. The programming voltage $V_{PP}$ then becomes equal to the supply voltage $V_{CC}$.

Between the instants $t_7$ and $t_9$, the increase of the programming voltage draws greater current than between the instants $t_9$ and $t_{10}$. This is expressed by a greater demand on the charge pump 1 which affects the value of the pumped voltage $V_{HT}$. At the instant $t_7$, the pumped voltage $V_{HT}$ has not yet reached the reference voltage, and the growth of the pumped voltage is slowed down. However, the delay has enabled the pumped voltage $V_{HT}$ to reach a sufficient level for a sufficient period of time. This makes it possible to have an accurate operation of the shaping circuit 2.

In the example described, the control circuit uses the combination of two conditions, one concerning the pumped voltage and the other concerning a temporary condition. These conditions are combined by means of an OR function. It is possible to limit the device to a control circuit using only one condition and using either a voltage detection circuit or a delay circuit.

If a control circuit is used comprising solely the delay circuit, the logic circuit must be replaced by an inverter gate in the diagram of FIG. 4. The predetermined duration must be computed so that, at the end of this duration, it is certain that the pumped voltage $V_{HT}$ has reached a sufficient level. The tolerance with respect to the real values of capacitance and resistance of an integrated circuit are such that the predetermined duration tends to be calculated on the basis of the worst case that can occur during the build-up time of the pumped voltage $V_{HT}$. The duration thus computed is relatively high for all the circuits that work more efficiently (namely 99% of the circuits produced) than the worst case circuit. The use of the predetermined duration only has the effect of fixing the duration of application of the maximum programming voltage by reproducing the worst case. This has the effect of increasing the programming time.

If a control circuit comprises only the voltage detection circuit, it is certain that the maximum value of the pumped voltage will be obtained, but there will be no control available on the delay caused by obtaining the value. There is then a very small possibility that the delay caused will not enable a maximum programming voltage $V_{PP}$ for a period of time long enough to ensure the programming of the memory cells. This has the effect of lowering the efficiency of production of the memories by the addition of an excessively severe constraint.

Those skilled in the art may make many variations to the invention without departing from the scope of the invention. Thus, the different voltage values and logic levels used in the example may be replaced by others in adapting the circuit. It is also possible to use a voltage detection circuit that is different from the regulator circuit of the charge pump in order to use a reference voltage that is different from the maximum value of the pumped voltage $V_{HT}$, but this would lead to the addition of a further circuit that would provide only an equivalent result.

That which is claimed is:

1. A memory device comprising:

a plurality of floating gate transistors; and
   a voltage generator circuit for generating a voltage for programming or erasing a trapped charge stored on at least one of the plurality of floating gate transistors, said voltage generator circuit comprising
   a charge pump for generating a pumped voltage,
   control means for generating a control signal,
   a switching circuit connected to an output of the charge pump for providing a switched voltage that is equal to the pumped voltage or to a neutral voltage as a function of the control signal, and
   a shaping circuit for generating a programming or erasure voltage based upon the switching voltage with an increase of the programming or erasure voltage being gradual.

2. A memory device according to claim 1, wherein the control means comprises a voltage detection circuit for generating the control signal as soon as the pumped voltage reaches a reference voltage.

3. A memory device according to claim 1, wherein the control means comprises a delay circuit for delaying generation of the control signal based upon a predetermined time after starting generation of the pumped voltage.

4. A memory device according to claim 1, wherein the switched voltage is equal to the pumped voltage when the control signal is active.

5. A memory device according to claim 1, wherein the control means comprises a voltage detection circuit and a delay circuit to activate the control signal as soon as the pumped voltage has reached a reference voltage or as soon as the charge pump has been activated for a predetermined duration and wherein the switching circuit provides the switched voltage equal to the pumped voltage to the shaping circuit when the control signal is active.

6. A memory device to claim 1, wherein the neutral voltage is in a range of about 0 to 3 volts.

7. A memory device comprising:

a plurality of floating gate transistors; and
   a voltage generator circuit for generating a voltage for programming or erasing a trapped charge stored on one of the plurality of floating gate transistors, said voltage generator circuit comprising
   a charge pump for generating a pumped voltage,
   a voltage detection circuit for generating a control signal when the pumped voltage reaches a reference voltage,
   a switching circuit connected to an output of the charge pump for providing a switched voltage that is equal to the pumped voltage or to a neutral voltage as a function of the control signal, and
   a shaping circuit for generating a programming or erasure voltage based upon the switched voltage with an increase of the programming or erasure voltage being gradual.

8. A memory device according to claim 7, wherein the switched voltage is equal to the pumped voltage when the control signal is active.

9. A memory device according to claim 7, wherein the neutral voltage is in a range of about 0 to 3 volts.

10. A memory device comprising:

a plurality of floating gate transistors; and
    a voltage generator circuit for generating a voltage for programming or erasing a trapped charge stored on at least one of the plurality of floating gate transistors, said voltage generator circuit comprising
    a charge pump for generating a pumped voltage,
    a delay circuit for delaying generation of a control signal based upon a predetermined time after starting generation of the pumped voltage,
    a switching circuit connected to an output of the charge pump for providing a switched voltage that is equal to the pumped voltage or to a neutral voltage as a function of the control signal, and
    a shaping circuit for generating a programming or erasure voltage based upon the switched voltage with an increase of the programming or erasure voltage being gradual.

11. A memory apparatus according to claim 10, wherein the switched voltage is equal to the pumped voltage when the control signal is active.

12. A memory according to claim 10, wherein the neutral voltage is in a range of about 0 to 3 volts.

13. A method for generating a programming or erasure voltage for programming or erasing a trapped charge stored on at least one of a plurality of floating gate transistors in a memory device, the method comprising the steps of:

generating a pumped voltage;
    generating a control signal;
    providing a switched voltage that is equal to the pumped voltage or to a neutral voltage as a function of the control signal; and
    generating the programming or erasure voltage based upon the switched voltage with an increase of the programming or erasure voltage being gradual.

14. A method according to claim 13, wherein the step of generating a control signal further comprises the step of detecting when the pumped voltage reaches a reference voltage.

15. A method according to claim 13, wherein the step of generating a control signal further comprises the step of delaying generation of the control signal based upon a predetermined time after starting generating the pumped voltage.

16. A method according to claim 13, wherein the switched voltage is equal to the pumped voltage when the control signal is active.

17. A method according to claim 13, wherein the neutral voltage is in a range of about 0 to 3 volts.

18. A method for generating a programming or erasure voltage for programming or erasing a trapped charge stored on at least one of a plurality of floating gate transistors in a memory apparatus, the method comprising the steps of:

generating a pumped voltage;

detecting when the pumped voltage reaches a reference voltage for generating a control signal;

providing a switched voltage that is equal to the pumped voltage or to a neutral voltage as a function of the control signal; and generating the programming or erasure voltage based upon the switched voltage with an increase of the programming or erasure voltage being gradual.

19. A method according to claim 18, further comprises the step of delaying generation of the control signal based upon a predetermined time after starting generating the pumped voltage.

20. A method according to claim 18, wherein the switched voltage is equal to the pumped voltage when the control signal is active.

21. A method according to claim 18, wherein the neutral voltage is in a range of about 0 to 3 volts.

* * * * *

UNITED STATES PATENT AND TRADEMARK OFFICE
CERTIFICATE OF CORRECTION

PATENT NO. : 5,978,268
DATED : November 2, 1999
INVENTOR(S) : Sebastien ZINK; David NAURA Page 1 of 8

It is certified that error appears in the above-identified patent and that said Letters Patent is hereby corrected as shown below:

In the Drawing, substitute therefore:

Figure 1    Strike Figure 1:
            Insert:

Figure 2a   Strike Figure 2a:
            Insert:

UNITED STATES PATENT AND TRADEMARK OFFICE
CERTIFICATE OF CORRECTION

PATENT NO. : 5,978,268
DATED : November 2, 1999
INVENTOR(S) : Sebastien ZINK; David NAURA Page 2 of 8

It is certified that error appears in the above-identified patent and that said Letters Patent is hereby corrected as shown below:

Figure 2b        Strike Figure 2b:
                 Insert:

FIG. 2b.
(PRIOR ART)

Figure 3         Strike Figure 3:
                 Insert:

FIG. 3.

UNITED STATES PATENT AND TRADEMARK OFFICE
CERTIFICATE OF CORRECTION

PATENT NO. : 5,978,268  Page 3 of 8
DATED : November 2, 1999
INVENTOR(S) : Sebastien ZINK: David NAURA It is certified that error appears in the above-identified patent and that said Letters Patent is hereby corrected as shown below:

Figure 4  Strike Figure 4:
Insert:

Figure 5A  Strike Figure 5A:
Insert:

UNITED STATES PATENT AND TRADEMARK OFFICE
CERTIFICATE OF CORRECTION

PATENT NO. : 5,978,268        Page 4 of 8
DATED     : November 2, 1999
INVENTOR(S) : Sebastien ZINK; David NAURA It is certified that error appears in the above-identified patent and that said Letters Patent is hereby corrected as shown below:

Figure 5E        Strike Figure 5E:
                 Insert:

FIG. 5E.

Figure 5F        Strike Figure 5F:
                 Insert:

Signed and Sealed this

Eighteenth Day of July, 2000

Attest:

Q. TODD DICKINSON

*Attesting Officer*                *Director of Patents and Trademarks*

UNITED STATES PATENT AND TRADEMARK OFFICE
CERTIFICATE OF CORRECTION

PATENT NO. : 5,978,268
DATED : November 2, 1999
INVENTOR(S) : Sebastien ZINK; David NAURA Page 5 of 8

It is certified that error appears in the above-identified patent and that said Letters Patent is hereby corrected as shown below:

Figure 6A        Strike Figure 6A:
                 Insert:

Figure 6B        Strike Figure 6B:
                 Insert:

Signed and Sealed this

Eighteenth Day of July, 2000

*Attest:*

Q. TODD DICKINSON

*Attesting Officer*    *Director of Patents and Trademarks*

UNITED STATES PATENT AND TRADEMARK OFFICE
CERTIFICATE OF CORRECTION

PATENT NO. : 5,978,268
DATED : November 2, 1999
INVENTOR(S) : Sebastien ZINK; David NAURA It is certified that error appears in the above-identified patent and that said Letters Patent is hereby corrected as shown below:

Figure 6C          Strike Figure 6C:
                   Insert:

Figure 6D          Strike Figure 6D:
                   Insert:

Signed and Sealed this

Eighteenth Day of July, 2000

Attest:

Q. TODD DICKINSON

*Attesting Officer*          *Director of Patents and Trademarks*

UNITED STATES PATENT AND TRADEMARK OFFICE
CERTIFICATE OF CORRECTION

PATENT NO.  : 5,978,268
DATED       : November 2, 1999
INVENTOR(S) : Sebastien Zink, David Naura It is certified that error appears in the above-identified patent and that said Letters Patent is hereby corrected as shown below:

Figure 6E            Strike Figure 6E:
                     Insert:

FIG. 6E.

Signed and Sealed this

Eighteenth Day of July, 2000

Attest:

Q. TODD DICKINSON

Attesting Officer    Director of Patents and Trademarks

UNITED STATES PATENT AND TRADEMARK OFFICE
CERTIFICATE OF CORRECTION

PATENT NO. : 5,978,268
DATED : November 2, 1999
INVENTOR(S) : Sebastien Zink, David Naura It is certified that error appears in the above-identified patent and that said Letters Patent is hereby corrected as shown below:

Figure 6F          Strike Figure 6F:
Insert:

FIG. 6F.

Signed and Sealed this

Eighteenth Day of July, 2000

Attest:

Q. TODD DICKINSON

Attesting Officer       Director of Patents and Trademarks

UNITED STATES PATENT AND TRADEMARK OFFICE
CERTIFICATE OF CORRECTION

PATENT NO. : 5,978,268
DATED : November 2, 1999
INVENTOR(S) : Sebastien Zink, et al.

It is certified that error appears in the above-identified patent and that said Letters Patent is hereby corrected as shown below:

The title page should be deleted and substitute therefore the attached title page as shown on the attached page.

Signed and Sealed this

Twenty-third Day of October, 2001

*Attest:*

*Attesting Officer*

NICHOLAS P. GODICI
*Acting Director of the United States Patent and Trademark Office*

United States Patent [19]

Zink et al.

[11] Patent Number: 5,978,268
[45] Date of Patent: Nov. 2, 1999

[54] CIRCUIT FOR THE GENERATION OF VOLTAGE FOR THE PROGRAMMING OR ERASURE OF A MEMORY THAT USES FLOATING-GATE TRANSISTORS

[75] Inventors: Sebastien Zink; David Naura, both of Aix-en-Provence, France

[73] Assignee: STMicroelectronics S.A., Gentilly, France

[21] Appl. No.: 09/179,635

[22] Filed: Oct. 27, 1998

[30] Foreign Application Priority Data

Oct. 29, 1997 [FR] France .................... 97 13751

[51] Int. Cl.[6] ............................................. G11C 7/00
[52] U.S. Cl. ..................... 365/185.18; 365/189.09; 365/226
[58] Field of Search ..................... 365/189.09, 189.11, 365/226, 194, 185.18

[56] References Cited

U.S. PATENT DOCUMENTS 5,101,381  3/1992  Kouzi.
5,408,133  4/1995  Honnigford et al.
5,446,697  8/1995  Yoo et al. ..................... 365/189.09
5,594,692  1/1997  Yamaguchi ................... 365/189.09

FOREIGN PATENT DOCUMENTS 0 811 987 A1  12/1997  European Pat. Off. ........ G11C 16/06
2 288 678  10/1995  United Kingdom .......... G11C 11/407
WO 97/48100  12/1997  WIPO ......................... G11C 16/06

*Primary Examiner*—Vu A. Le
*Attorney, Agent, or Firm*—Allen, Dyer, Doppelt, Milbrath & Gilchrist, P.A.

[57] ABSTRACT

A voltage circuit generates a programming or erasure voltage for programming or erasing a floating-gate memory. The voltage generator circuit includes a charge pump to provide a pumped voltage and a shaping circuit to provide the programming or erasing voltage from the pumped voltage. A switching circuit enables the pumped voltage to reach a sufficient level before the shaping circuit generates the programming or erasure voltage.

21 Claims, 3 Drawing Sheets